(12) United States Patent
Yoon et al.

(10) Patent No.: US 12,434,388 B2
(45) Date of Patent: Oct. 7, 2025

(54) CARRIAGE ROBOT AND TOWER LIFT INCLUDING THE SAME

(71) Applicant: SEMES CO., LTD., Cheonan-si (KR)

(72) Inventors: Eun Sang Yoon, Suwon-si (KR); Seung Keun Jun, Cheonan-si (KR); Hyi Jae Kang, Seoul (KR); Jun Ho Lee, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 437 days.

(21) Appl. No.: 17/514,223

(22) Filed: Oct. 29, 2021

(65) Prior Publication Data

US 2022/0134575 A1     May 5, 2022

(30) Foreign Application Priority Data

Oct. 30, 2020   (KR) .................. 10-2020-0143760

(51) Int. Cl.
| | |
|---|---|
| *H01L 21/677* | (2006.01) |
| *B25J 5/02* | (2006.01) |
| *B25J 9/00* | (2006.01) |
| *B25J 11/00* | (2006.01) |
| *B25J 13/08* | (2006.01) |

(Continued)

(52) U.S. Cl.
CPC .............. *B25J 11/0095* (2013.01); *B25J 5/02* (2013.01); *B25J 9/0087* (2013.01); *B25J 13/08* (2013.01); *B25J 15/009* (2013.01); *H01L 21/67712* (2013.01); *H01L 21/6773* (2013.01); *H01L 21/68707* (2013.01)

(58) Field of Classification Search
CPC ......... H01L 21/68728; H01L 21/67766; H01L 21/67742; B25J 11/0095; B25J 9/042; B25J 9/043
See application file for complete search history.

(56) References Cited

U.S. PATENT DOCUMENTS

| | | | |
|---|---|---|---|
| 9,033,645 B2 * | 5/2015 | Chen .................... | B65G 49/068 414/744.8 |
| 2005/0145464 A1 | 7/2005 | Rice et al. | |

(Continued)

FOREIGN PATENT DOCUMENTS

| | | |
|---|---|---|
| JP | 11-286388 | 10/1999 |
| JP | 2004315191 A  * | 11/2004 |

(Continued)

OTHER PUBLICATIONS

Japanese Office Action with English translation for Japanese Patent Application No. 2021-177134, dated Dec. 6, 2022.

(Continued)

*Primary Examiner* — Gerald McClain
(74) *Attorney, Agent, or Firm* — KILE PARK REED & HOUTTEMAN PLLC (57) ABSTRACT

A carriage robot includes a robot arm being configured to transport a plurality of containers, a robot hand connected to an end of the robot arm, the robot hand being configured to support a first container having a first size among the containers, and a gripper provided under the robot hand, the gripper being configured to grip a second container having a second size different from the first size. Thus, the carriage robot is capable of transport the containers, each having a size different from each other.

13 Claims, 9 Drawing Sheets

(51) Int. Cl.
    *B25J 15/00*     (2006.01)
    *H01L 21/687*     (2006.01)

(56) References Cited

U.S. PATENT DOCUMENTS

| | | | |
|---|---|---|---|
| 2014/0033852 A1* | 2/2014 | Chen | B25J 18/02 |
| | | | 901/27 |
| 2019/0152721 A1* | 5/2019 | Xu | H01L 21/67724 |
| 2020/0161161 A1* | 5/2020 | Wu | B65G 47/905 |
| 2020/0270058 A1* | 8/2020 | Sai | H01L 21/67766 |

FOREIGN PATENT DOCUMENTS

| | | | |
|---|---|---|---|
| JP | 2007055698 A | * | 3/2007 |
| JP | 2011-71434 | | 4/2011 |
| JP | 2020-93306 | | 6/2020 |
| KR | 10-2007-0060053 | | 6/2007 |
| KR | 20070060053 A | * | 6/2007 |
| KR | 10-2018-0047089 | | 5/2018 |
| KR | 20180047089 A | * | 5/2018 |

OTHER PUBLICATIONS

Korean Office Action with English translation for Korean Patent Application or Patent No. 10-2020-0143760, dated Dec. 26, 2022.

\* cited by examiner

CARRIAGE ROBOT AND TOWER LIFT INCLUDING THE SAME

CROSS-REFERENCE TO RELATED APPLICATION

This application claims priority to Korean Patent Application No. 10-2020-0143760, filed on Oct. 30, 2020, and all the benefits accruing therefrom under 35 U.S.C. § 119, the contents of which are incorporated by reference in their entirety.

TECHNICAL FIELD

The present disclosure relates to a carriage robot and a tower lift including the same. More particularly, the present disclosure relates to a carriage robot capable of carrying containers having sizes different from each other, and a tower lift including the carriage robot capable of carrying containers having sizes different from each other from/to floors.

BACKGROUND

In general, a manufacturing system for manufacturing a semiconductor device or a display device has a multiple floored structure and includes a plurality of manufacturing apparatuses installed at each of floors for each performing a unit process such as deposition, exposure, etching, ion implantation, and cleaning, etc.

By repeatedly performing a series of unit processes against either a silicon wafer used as a semiconductor substrate or a glass substrate used as a display substrate, the semiconductor device or the display device may be manufactured On the other hand, a tower lift may extend to operate in a vertical direction through each of the floors to transport a substrate in the vertical direction between the respective floors. The tower lift may include a carriage robot having a transfer robot for transferring a container of stacking a plurality of substrates. Further, the tower lift may transport a plurality of container having sizes different from each other, such as a first container for receiving silicon wafers, a second container for receiving a reticle, and the like.

Accordingly, it would be necessary to implement a container transport system capable of suppressing a decrease in transport efficiency while collecting and transporting different sized containers.

SUMMARY

Some embodiments of the present invention provide a carriage robot The carriage robot includes a robot arm being configured to transport a plurality of containers, a robot hand connected to an end of the robot arm, the robot hand being configured to support a first container having a first size among the containers, and a gripper provided under the robot hand, the gripper being configured to grip a second container having a second size different from the first size.

In an example embodiment, the second container may include a holding part at an upper portion thereof, and the gripper may be configured to grip the holding part in a sliding way.

Here, the gripper may include a first gripping part and a second gripping part spaced apart from each other at an interval corresponding to a width of the holding part.

Further, each of the first gripping part and the second gripping part may have a "C" shape to face each other, and one of the first and the second gripping part may include a photo sensor at an end portion thereof, and the other of the first and the second gripping part may include a reflector at an end portion thereof.

In an example embodiment, the robot arm may have a thickness corresponding to a height of the second container.

In an example embodiment, the robot arm may have at least two or more stacked arms, and an uppermost arm included in the robot arm may have a thickness corresponding to a height of the second container.

In an example embodiment, the carriage robot may further include a guide part disposed on a lower surface of the robot hand without interfering the gripper, the guide part being configured to suppress the second container from vibrating while transporting the second container.

In an example embodiment, the carriage robot may further include a control unit being configured to adjust an operating speed of the robot arm differently in accordance with a first container and a second container.

In an example embodiment, the robot hand may include a supporting pin corresponding to a guide groove formed on a lower surface of the first container.

Some embodiments of the present invention provide a tower lift. The tower lift includes a guide rail extending in a vertical direction, and at least one carriage robot being configured to be movable in the vertical direction along the guide rail, the carriage robot being configured to transport a plurality of container, wherein the carriage robot includes a robot arm being configured to transport the plurality of containers, a robot hand connected to an end of the robot arm, the robot hand being configured to support a first container having a first size among the containers, and a gripper provided under the robot hand, the gripper being configured to grip a second container having a second size different from the first size.

In an example embodiment, the second container may include a holding part at an upper portion thereof, and the gripper may be configured to grip the holding part in a sliding way.

In an example embodiment, the gripper may include a first gripping part and a second gripping part spaced apart from each other at an interval corresponding to a width of the holding part.

Here, each of the first gripping part and the second gripping part may have a "C" shape to face each other, and one of the first gripping part and the second gripping part may includes a photo sensor at an end portion thereof, and the other of the first gripping part and the second gripping part may includes a reflector at an end portion thereof.

In an example embodiment, the robot arm may have a thickness corresponding to a height of the second container.

In an example embodiment, the robot arm may have at least two or more stacked arms, and an uppermost arm included in the robot arm may have a thickness corresponding to a height of the second container.

In an example embodiment, the carriage robot may further include a guide part disposed on a lower surface of the robot hand without interfering the gripper, the guide part being configured to suppress the second container from vibrating while transporting the second container.

In an example embodiment, the carriage robot may further include a control unit being configured to adjust an operating speed of the robot arm differently in accordance with a first container and a second container.

Some embodiments of the present invention provide a tower lift. The tower lift. The tower lift includes a guide rail extending in a vertical direction, an elevating body being configured to be moveable in the vertical direction along the guide rail, and a first carriage robot and a second carriage robot being connected to the elevating body, the first carriage robot being configured to transport a first container and a second container each having a first size and a second size different from each other, and the second carriage robot being configured to transport the first container, wherein the first carriage robot includes a first robot arm being configured to transport either the first container or the second container, a first robot hand connected to an end of the first robot arm, the first robot hand being configured to support the first container having the first size, and a first gripper provided under the first robot hand, the first gripper being configured to grip the second container having the second size, and wherein the second carriage robot may include a second robot arm being configured to transport the first container, a second robot hand connected to an end of the second robot arm, the second robot hand being configured to support the first container having the first size.

In an example embodiment, the second container may include a holding part at an upper portion thereof, and the first gripper may be configured to grip the holding part in a sliding way.

In an example embodiment, the gripper may include a first gripping part and a second gripping part spaced apart from each other at an interval corresponding to a width of the holding part.

According to example embodiments of the present invention, the robot hand is provided for supporting the first container having a first size and the gripper is disposed on a lower portion of the robot hand for holding the second container having the second size different from the first size gripper. Accordingly, the carriage robot can simultaneously transport the first container and the second container having the sized different from each other.

On the other hand, when the logistics volume of transporting the first container is greater than that of transporting the second container, the carriage robot transports the first container at a relatively high speed while the carriage robot stably supports the first container in the supporting way, thereby improving transport efficiency.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Example embodiments can be understood in more detail from the following description taken in conjunction with the accompanying drawings, in which.

DETAILED DESCRIPTION

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

Hereinafter, specific embodiments on a raceway unit and an OHT having the same will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout. In the figures, the dimensions of layers and regions are exaggerated for clarity of illustration.

The terms such as first, second, etc., can be used in describing various elements, but the above elements by the above terms should not be limited. The above terms are one element from the other used only to distinguish. For example, in the present invention without departing from the scope of the first component to the second component may be named similarly, the second component to the first component also can be named.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
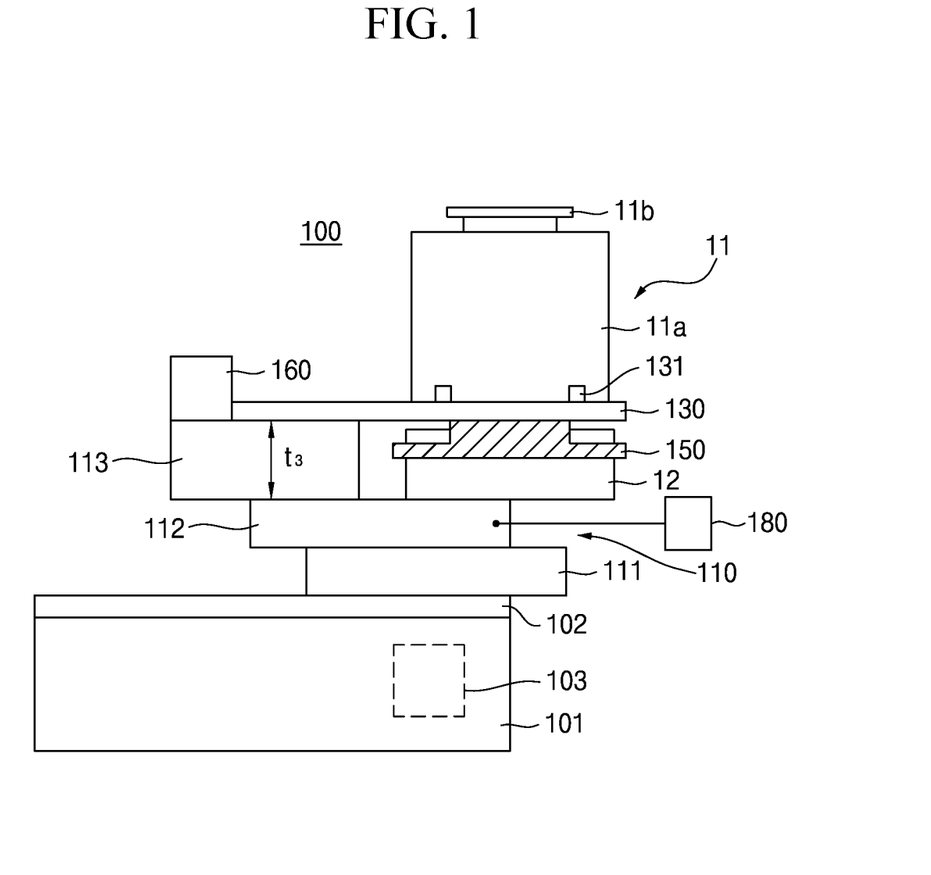
FIG. 1 is a side view illustrating a carriage robot according to an example embodiment of the present invention.
Figure 2:
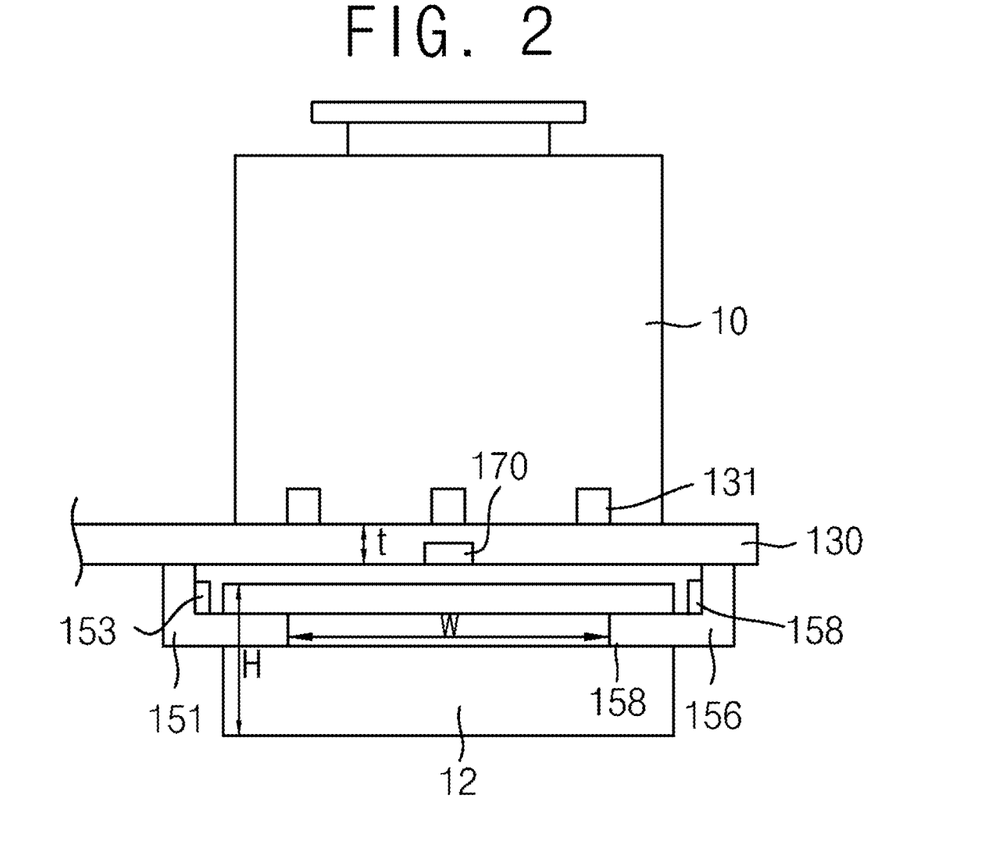
FIG. 2 is a partial side view illustrating the robot hand and the gripper shown in FIG. 1.
Figure 3:
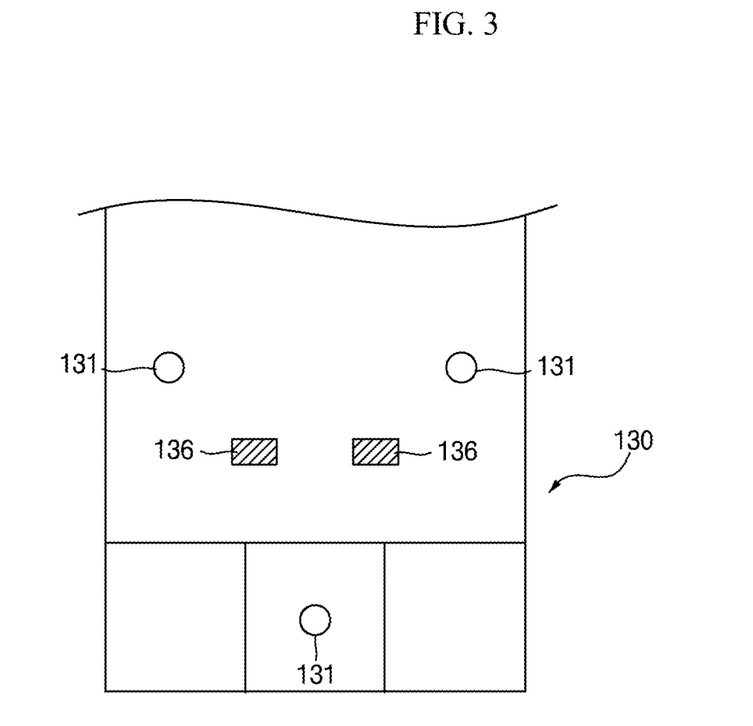
FIG. 3 is a plan view illustrating the robot hand in FIG. 1.

FIG. 1 is a side view illustrating a carriage robot according to an example embodiment of the present invention. FIG. 2 is a front view illustrating the robot hand and the gripper shown in FIG. 1. FIG. 3 is a plan view illustrating the robot hand in FIG. 1.

Referring to FIGS. 1 to 3, a carriage robot 100 according to an example embodiment of the present invention includes a robot arm 110, a robot hand 130 and a gripper 150. The carriage robot 100 may transport different sized containers between multiple positions. The container may include a first container 11 having a first size such as a Front Opening Unified Pod (FOUP) and a Front Opening Shipping Box (FOSB) for accommodating a wafer, and a second container 12 having a second size such as a POD for accommodating a reticle.

The robot arm 110 may stretch out or shorten to have a variable length to transport the containers 11 and 12 having different sizes between a first loading position and a second loading position. The robot arm 110 may include an articulated robot arm structure including a plurality of arms 111, 112, and 113 connected to one another. The arms 111, 112 and 113 are provided to connect an end portion of an upper arm to an end portion of a lower arm, respectively.

When the arms 111, 112, and 113 are vertically folded, the robot hand 130 and the gripper 150 may be positioned in the first loading position. In this case, the first loading position may correspond to an entry position of the robot arm 110. On the other hand, when the arms 111, 112, and 113 are mutually unfolded to extend, the robot hand 130 and the gripper 150 may be positioned in the second loading position. In this case, the second loading position may correspond to an exit position of the robot arm 110.

A base member 101 may be further provided to support the robot arm 110. In addition, a guide member 102 may be further disposed on the base member 101 to guide a movement of the robot arm 110 in a horizontal direction. On the other hand, a rotation driving unit 103 is further provided inside the base member 101 with being mechanically connected to the robot arm 110. Accordingly, the rotation driving unit 103 may rotate the robot arm 110.

The robot hand 130 is connected to an end portion of the robot arm 110. The robot hand 130 is connected to, for example, an uppermost arm 113 among the arms included in the robot arm 110. As shown, the robot hand 130 may be connected to a distal end portion of the uppermost arm 113. The robot hand 130 may support the first container 11 having the first size. The robot hand 130 includes an upper surface being configured to support the first container 11. The first container 11 may include a first accommodating part 11a for accommodating the wafer therein, and a first holding part 11b provided on the first accommodating part 11a. The first holding part may have a T-shape.

The robot hand 130 includes supporting pins 131 on an upper surface thereof. The supporting pins 131 may be arranged to be spaced apart from each other. In this case, the supporting pins 131 are arranged to correspond to an arrangement of guide grooves formed in a lower surface of the first container 11. Accordingly, the supporting pins 131 are inserted into the guide grooves formed in the first container 11, so that the robot hand 130 may securely support the first container 11. As a result, the robot hand 130 may suppress the first container 11 from dropping from the robot hand 130 owing to the supporting pins 131 while the first container 11 is being transported.

In particular, when the first container 11 corresponds to the FOUP or the FOSB, even though having a relatively large mass, the robot hand 130 may safely support the first container 11 in a supporting way rather than in a gripping way. Thus, a drop of the first container 11 from the robot hand 130 for a transport time may be effectively suppressed.

A recognition sensor 136 may be provided on the upper surface of the robot hand 130. The recognition sensor 136 may include a light sensor, a load cell, etc. Accordingly, the recognition sensor 136 may detect whether the first container 11 is seated on the robot hand 130 or not.

The gripper 150 is disposed under the robot hand 130. For example, the gripper 150 is provided to face the supporting pins 131 with interposing a body of the robot hand 130 between thereof.

The gripper 150 may grip the second container 12 (e.g., POD) having the second size different from the first size of the first container 11. The second container 12 is relatively light compared to the first container 11 to decrease a risk of falling down. Accordingly, when the gripper 150 grips the second container 12 in the gripping way, the second container 12 may be suppressed from falling from the gripper 150. In this case, the second container 12 includes a second receiving part 12a (refer to FIG. 4) for accommodating the reticle therein, and a second holding part 12b disposed on the receiving part 12a. The second holding part 12b may have a T-shape.

The gripper 150 may grip the second holding portion 12b positioned at the second receiving part 12a in a sliding way. That is, since the carriage robot 100 approaches to the second container 12, the gripper 150 approaches the second holding part 12b and lifts up the second holding part 12b. Thus, the gripper 150 may grip the second container 12.

For example, the gripper 150 may include a pair of first and second gripping parts 151 and 156 spaced apart from each other. The pair of first gripping parts 151 and second gripping parts 156 may have a spacing distance corresponding to the width W of the second holding part 12b.

Accordingly, a driving part for spacing or approaching the first and second gripping parts 151 and 156 with respect to the second holding part 12b may not be necessary.

Further, as the carriage robot 100 approaches to or move away from the second container 12, the gripper 150 may either grip the second container 12 or release the second container 12 from a gripping state.

According to example embodiments of the present invention, the carriage robot 100 includes the robot hand 130 capable of supporting the first container 11 having the first size, and the gripper 150 being disposed under the robot hand 130, being capable of gripping the second container 12 having the second size different from the first size. Accordingly, the carriage robot 100 may either selectively transport one of the first container 11 and the second container 12 or simultaneously transport both the first container 11 and the second container 12.

Furthermore, the carriage robot 100 may support the first container 11 having a relatively high weight by the supporting way rather than the gripping way Accordingly, the carriage robot 100 may transport the first container 11 at a relatively high speed while stably supporting the first container 11.

In particular, when a logistics volume of transporting the first container 11 is greater than that of transporting the second container 12, the carriage robot 100 transfers the first container 11 at a relatively high moving speed while the robot hand 130 stably supports only the first container 11. Therefore, the carriage robot 100 may realize an improved conveying efficiency.

In an example embodiment of the present invention, each of the first and second gripping parts 151 and 156 may have a L-shape. Further, the first and second gripping parts 151 and 156 face each other. The first and second grippers 151 and 156 are symmetrically arranged. Accordingly, a gripping space is defined between the first and second gripping parts 151 and 156 having the L-shape. The second holding part 12b of the second container 12 may be accommodated in the gripping space.

In an example embodiment of the present invention, one of the first and second grippers 151 and 156 may include a photosensor 153, and the other includes the reflector 158. Accordingly, the photosensor 153 and the reflector 158 may determine whether the second holding part 12b exists in the gripping space or not. That is, a pair of the photosensor 153 and the reflector 158 may detect whether the second container 12 is gripped.

In an example embodiment of the present invention, the robot arm 110 has a thickness $t_3$ corresponding to a height h of the second container 12 in a vertical direction. Accordingly, when the gripper 150 grips the second container 12, the base member 101 may make contact with a lower surface of the second container 12. Since the base member 101 supports the second container 12, the second container 12 may be suppressed from falling while the carriage robot 110 transports the second container 12.

In an example embodiment of the present invention, the robot arm 110 includes at least two or more stacked arms. That is, the robot arm 110 includes a first arm 111, a second arm 112 and a third arm 113 of which each of end portions thereof are sequentially connected to one another.

For example, the height h of the second container 12 may be substantially identical to a thickness $t_3$ of an uppermost arm included in the robot arm, for example, the third arm 113. When the gripper 150 grips the second container 12, the second arm 112, positioned under the third arm 113 as the uppermost arm, may make contact with the lower surface of the second container 12. Since the second arm 112 supports the second container 12, the second container 12 may be suppressed from falling while the carriage robot 100 transports the second container 12.

In an example embodiment of the present invention, the carriage robot 100 may further include a guide part 170. The guide part 170 is disposed on the lower surface of the robot hand 130 and apart from the gripper 150 for avoiding the interference with the gripper 150. The guide part 170 may be configured to guide a side portion of the second container 12 to suppress the second container 12 from vibration while the carriage robot 100 transports the second article 12. The guide part 10 may be provided at an outer periphery position of the robot hand 130.

In addition, the guide part 170 may be provided to able to move in a vertical direction. Accordingly, when the gripper 150 grips the second container 12, the guide part 170 may descend to contact the side portion of the second container 12. As a result, the guide part 170 can suppress the second container 12 from dropping from the carriage robot 100 while being transported.

In an example embodiment of the present invention, the carriage robot may further include a control unit 180 which is provided to adjust a driving speed of the robot arm 110 according to whether either the first container 11 or the second container 12 is transported. That is, the controller 180 may control a driving power of a driving motor (not shown), and may adjust the driving speed of the robot arm 110.

For example, when the robot hand 130 connected to the robot arm 110 supports the first container 11 only, the robot hand 130 may be capable of stably supporting the first container 11. The carriage robot 100 may transport the first container 10 at a relatively high transport speed. On the other hand, when the gripper 130 connected to the robot arm 110 grips the second container 12, the gripper 150 may grip the second container 12 relatively unstably. Accordingly, the carriage robot 100 may transport the second container 12 at a relatively low transport speed, thereby preventing the second container 12 from falling from the gripper 150.

As a result, when the logistics volume of transporting the first container 11 is greater than that of transporting the second container 12, the carriage robot 100 may transport the first container at the high transport speed, thereby improving the transport efficiency of the carriage robot 100.

Figure 4:
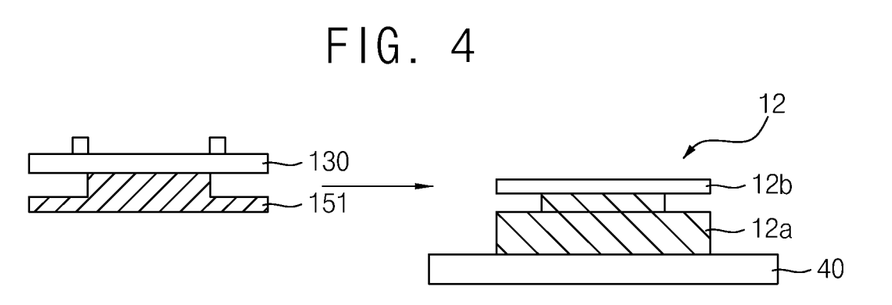
FIG. 4 is a side view illustrating the carriage robot of FIG. 1 of moving toward the second container.
Figure 5:
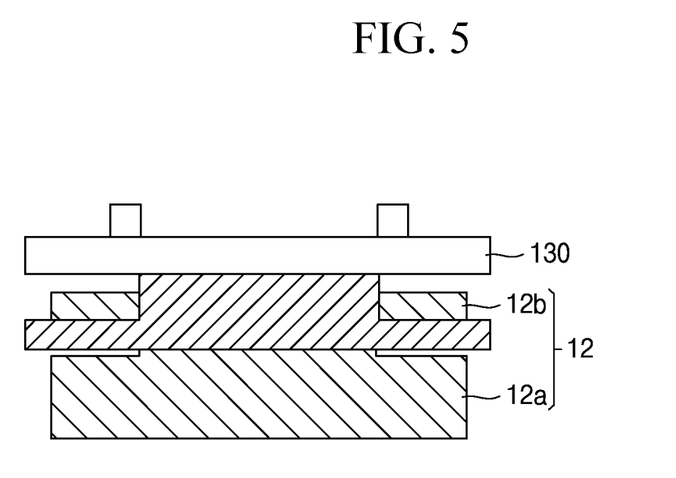
FIG. 5 is a side view illustrating a state in which the carriage robot of FIG. 4 grips the second container.

FIG. 4 is a side view illustrating the carriage robot of FIG. 1 of moving toward the second container. FIG. 5 is a side view illustrating a state in which the carriage robot of FIG. 4 grips the second container.

Referring to FIG. 4, the carriage robot 100 shown in FIG. 1 approaches to the second container 12. In this case, the second container 12 may be located on the conveyor 40. In addition, as the robot arm 110 included in the carriage robot 100 stretch to approach to the second container 1 located on the conveyor 40.

When the robot arm 110 includes the articulated arm structure including the first to third arms 111, 112 and 113 (refer to FIG. 1), the first to third arms 111, 112 and 113 are stretched out to approach to the second container 12. In addition, the robot hand 130 may descend in the vertical direction such that the first and the second gripping parts 151 and 156 included in the gripper 150 may descend in the vertical direction as well to have the same vertical position corresponding to the vertical position of the second holding part 12b included in the second container 12.

That is, a lifting driving unit 160 (see FIG. 1) is provided on the uppermost arm of the robot arm 110 to be configured to be connected to the robot hand 130. The lifting driving unit 160 may vertically elevate the robot hand 130.

Referring to FIG. 5, the second holding part 12b is inserted into the gripping space formed between the first and second gripping parts 151 and 156 included in the gripper 150 such that the gripper 150 may grip the second container 12.

Figure 6:
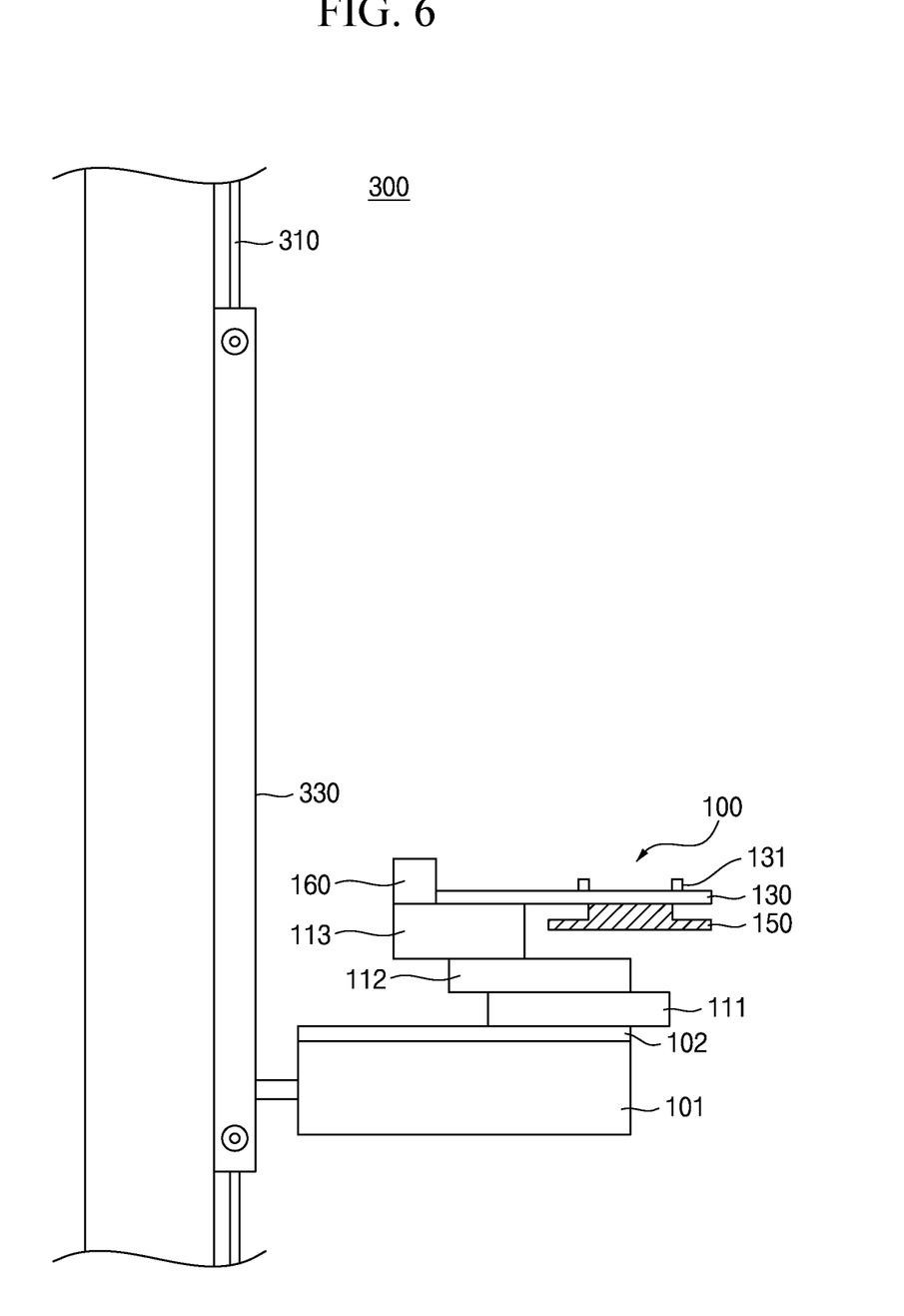
FIG. 6 is a side view illustrating a tower lift according to an example embodiment of the present invention.

FIG. 6 is a side view illustrating a tower lift according to an example embodiment of the present invention.

Referring to FIGS. 1 and 6, a tower lift 300 according to an example embodiment of the present invention includes a guide rail 310 and a carriage robot 100.

The carriage robot 100 has a plurality of elements substantially identical to those of the carriage robot described with reference to FIG. 1, a detailed description thereof will be omitted.

The guide rail 310 is connected to the carriage robot 100. The guide rail 310 provides a guide path for elevating the carriage robot 100 in a vertical direction. The guide rail 310 extends in the vertical direction.

The tower lift 300 may further includes an elevating body 330. The elevating body 330 is fastened to the guide rail 310 to be capable of elevating along the guide rail 310. The base member 101 interconnects the carriage robot 100 and the elevating body 330. Accordingly, the carriage robot 100 can be lifted and lowered together with the elevating body 330 along the guide rail 310.

Figure 7:
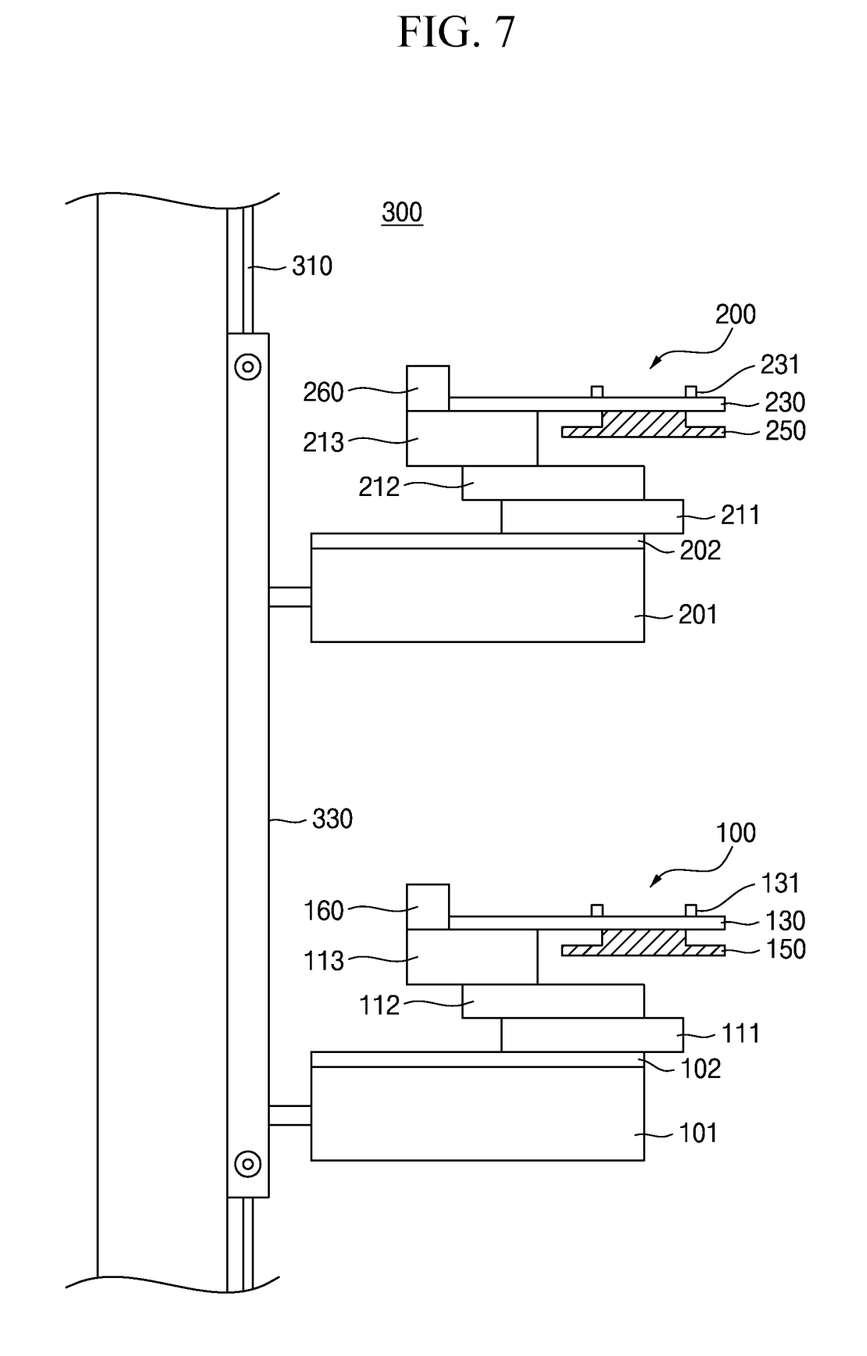
FIG. 7 is a side view illustrating a tower lift according to an example embodiment of the present invention.

FIG. 7 is a side view illustrating a tower lift according to an example embodiment of the present invention.

Referring to FIGS. 1 and 7, a tower lift 300 according to an example embodiment of the present invention includes a guide rail 310, a first carriage robot 100 and a second carriage robot 200. Since the first carriage robot 100 includes elements identical to those of the carriage robot described above with reference to FIG. 1, a detailed description thereof will be omitted.

The second carriage robot 200 is located over the first carriage robot 100. The second carriage robot 200 is fastened to an elevating body 330 together with the first carriage robot 100. Accordingly, each of the first and second carriage robots 100 and 200 may simultaneously transport the first container 11 and the second container 12.

Alternatively, the second carriage robot 200 may omit the gripper 150 from all elements of the first carriage robot 100. Accordingly, the second carriage robot 200 may support only the first container 11. That is, in the configuration of the second carriage robot 200, the gripper may be either provided or omitted according to the logistics volume of transporting the second container 12.

Figure 8:
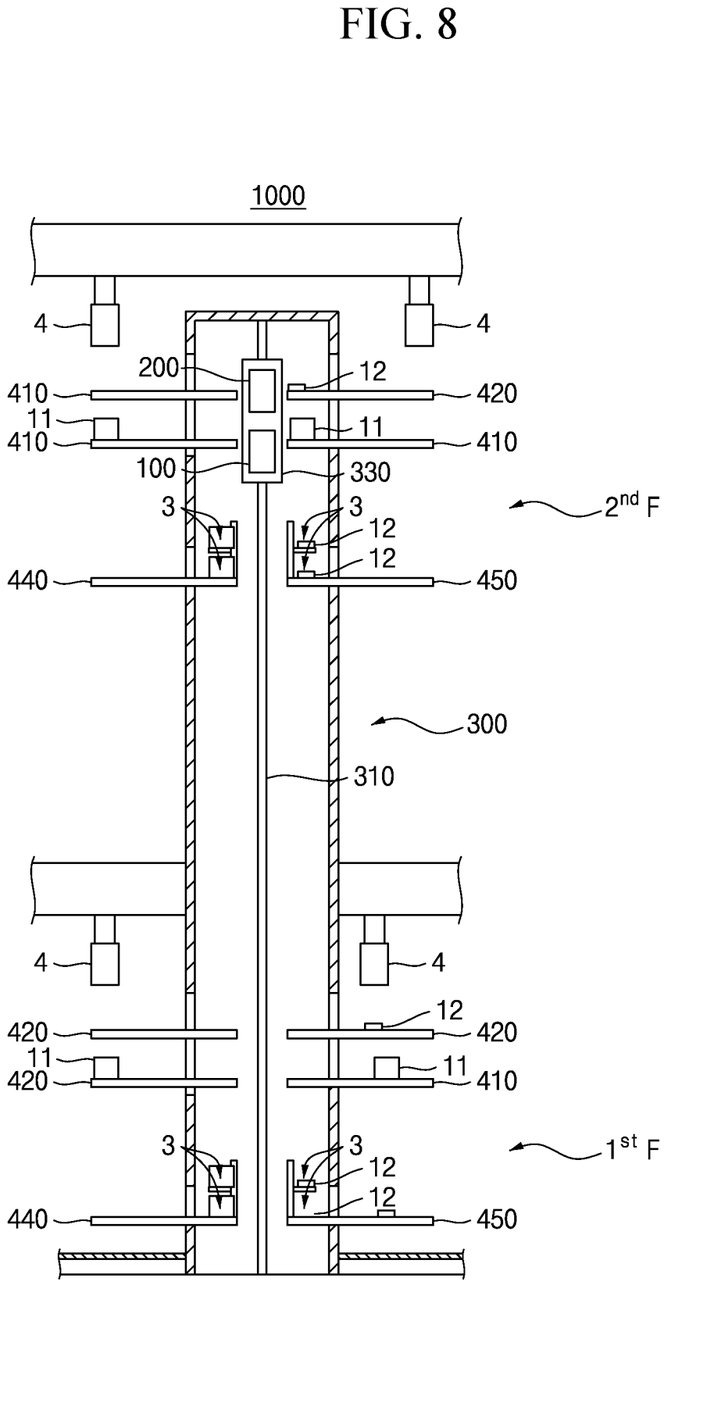
FIG. 8 is a front view illustrating a container transport system according to an embodiment of the present invention.
Figure 9:
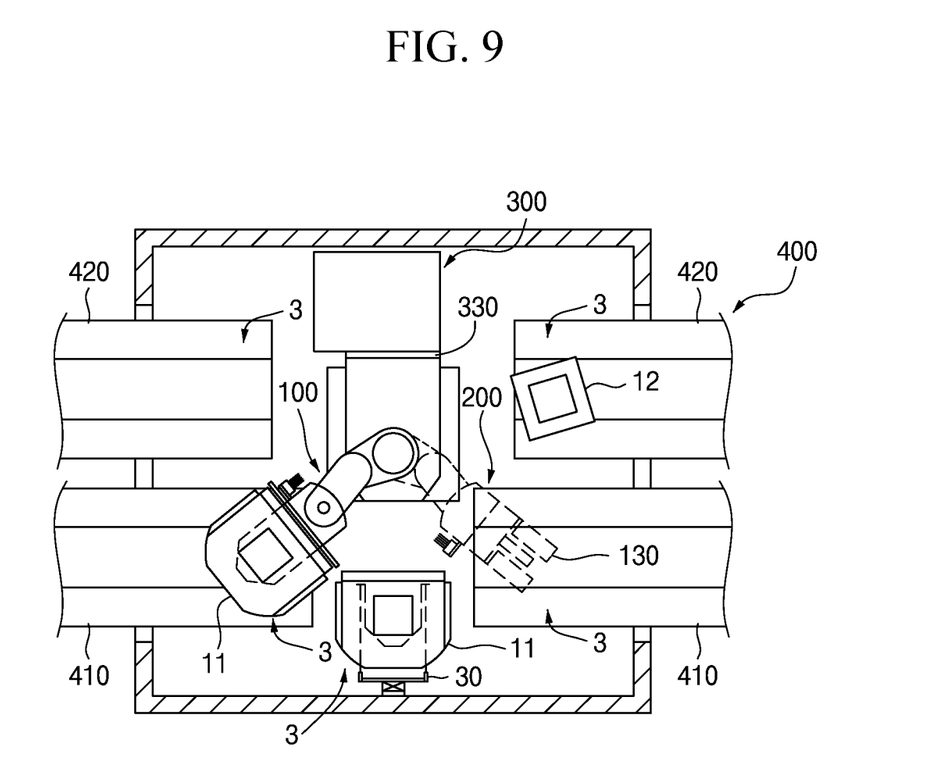
FIG. 9 is a plan view illustrating the conveyor of FIG. 8.
Figure 10:
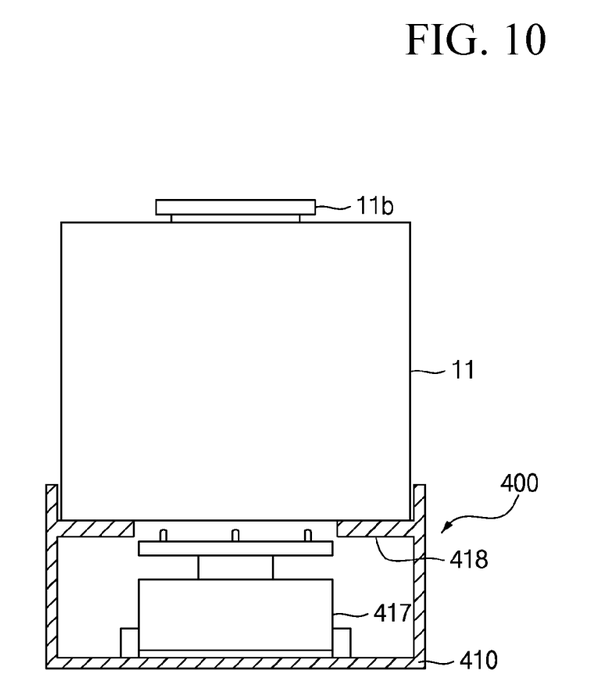
FIG. 10 is a cross-sectional view illustrating the conveyor of FIG. 8.

FIG. 8 is a front view illustrating a container transport system according to an embodiment of the present invention. FIG. 9 is a plan view illustrating the conveyor of FIG. 8. FIG. 10 is a cross-sectional view illustrating the conveyor of FIG. 8.

Referring to FIGS. 1 and 8 to 10, a container transport system 1000 according to an example embodiment of the present invention includes a tower lift 300 and a conveyor transport apparatus 400. The tower lift 300 transports a plurality of containers between a first floor 1st F and a second floor 2nd F positioned over the first floor 1sf F. The conveyor transport apparatus 400 is provided on each of the 1st floor 1st F and the second floor 2nd F, and is configured to conveys a first container 11 and a second container 12 along a horizontal direction. On the other hand, an overhead hoist transfer unit 4 is further provided on a ceiling of each of the floors. The overhead hoist transfer unit 4 is configured to transport the containers in a vertical direction.

Accordingly, each of the tower lift 300 and the conveyor transport apparatus 400 transfers the first container 11 and the second container 12 having different sizes in the vertical direction and the horizontal direction, respectively.

When the conveyor transport apparatus 400 conveys the first container 11 and the second container 12, a first holding part 11a included in the first container 11 is a height higher than that of the holding part 12a included in the second container 12. Meanwhile, a logistics volume of transporting the first container 11 may be greater than that of transporting the second container 12.

In an example embodiment, the first container 11 may include a container for an EUV process with accommodating a wafer such as a semiconductor wafer, and the second container 12 may include a container for accommodating a reticle. For example, the first container T1 is a Front Opening Unified Pod (FOUP) and a Front Opening Shipping Box (FOSB), while the second container 12 is a container for accommodating a reticle such as POD. At this time, the first holding part 11a and the second part 12a correspond to a flange part provided on an upper surface of each container.

The tower lift 300 includes a first carriage robot 100, a second carriage robot 200, an elevating body 330 and a guide rail 310.

The first carriage robot 100 is configured to transfer the first container 11 and the second container 12 between a plurality of the conveyor transport apparatus 400.

On the other hand, the second carriage robot 200 may be configured to transport only the first container 11 between the conveyor transport apparatus 400.

Alternatively, the second carriage robot 200 is configured to transfer and unload the first container 11 and the second container 12 between the conveyor transport apparatus 400.

Referring again to FIGS. 8 and 9, a buffer unit 30 is further provided adjacent to an elevating body 330 for temporarily support the containers 11 and 12. The buffer unit 30 is positioned beside to an end portion of a plurality of conveyors 410 and 420 included in the conveyor transport apparatus 400. Thus, the buffer unit 30, the elevating body 330 and the end portions of the conveyors 410 and 420 are adjacent to one another. Further, the buffer unit 30 and the end portions of the conveyors 410 and 420 defines a plurality of loading positions 3.

A first carriage robot 100 transports the first container 11 and the second container 21 between the buffer unit 30 and the conveyor transport apparatus 400 at the same time or sequentially at the loading positions 3.

Further, a second carriage robot 200 transports the first container 11 and the second container 21 between the buffer unit 30 and the conveyor transport apparatus 400.

The first carriage robot 100 includes a first robot arm 110, a first robot hand 130 and a first gripper 150. Since the first carriage robot 100 has been in detail described with reference to FIG. 7, a detailed description thereof will be omitted.

The second carriage robot 200 includes a second robot arm 210, a second robot hand 230 and a second gripper 250. Since the second carriage robot 200 has been in detail described with reference to FIG. 7, a detailed description thereof will be omitted also.

Referring to FIG. 9, the first carriage robot 100 transfers the first container 11 and the second container 12 between the loading positions 3.

The first carriage robot 100 may fold or unfold the first robot arm 110 to move both the first robot hand 130 and the first gripper 150 between the loading positions 3. In addition, the first carriage robot 100 includes a first lifting driving unit 160 being configured to either lift the first robot hand 130 from a lower position to an upper position or descend the first robot hand 130 from the upper position to the lower position.

Accordingly, the first carriage robot 100 includes the robot hand 130 and the gripper 150 which are capable of either moving both in a horizontal direction and in a vertical direction to transfer the first and second containers 11 and 12 between the loading position 3 with holding or unloading the first and the second container 11 and 12 at the loading positions 3.

In particular, when the first carriage robot 100 holds both the first and second containers 11 and 12 simultaneously, the carriage robot 100 holds the first and second containers 11 and 12 without any order. However, when the first carriage robot 100 unloads both the first and second containers 11 and 12 to one of the loading positions 3, the first carriage robot 100 unloads the second container 12 at one of the loading positions 3, and then, unloads the first container 11 at another of the loading positions 3 later.

On the other hand, the first carriage robot 100 may transport the first container 11 in a state in where carrying only the first container 11 at a transferring speed higher than that of transferring the second container 12. This is because the first carriage robot 100 may carry the first container 11 in a supporting way to transport the first container 11 more securely than in case where carrying only the second container 12 in a gripping way.

Referring again to FIG. 9, the first conveyor 410 is provided as a pair of conveyors for each carrying in and for carrying out the first container 11 in a horizontal direction. In addition, the second conveyor 420 is provided as a pair of conveyors for each carrying in and carrying out the second container 12 in the horizontal direction.

Referring back to FIG. 8, the conveyor transport apparatus 400 may further include a third conveyor 440 and a fourth conveyor 450 for each loading the first container 11 and the second container 12 to the loading positions 3, respectively.

The third conveyor 440 and the fourth conveyor 450 are positioned under the first conveyor and near a bottom surface of each floor. One end of the third conveyor 440 corresponds to one of the loading positions 3, and the other end corresponds to a position where an operator may load the first container 11. Meanwhile, one end of the fourth conveyor 450 corresponds to one of the loading positions 3, and the other end corresponds to a position where the operator may load the second container 12.

Referring to FIG. 10, the first conveyor 410 may include a first transport cart 417 being capable of moving along the horizontal direction to transport the first container 11, and a first inner support 418 installed at one end of a movement path of the first transport cart 417 and configured to support the first container 11.

Further, the first inner support 418 is positioned adjacent to one of the loading positions 3. The carriage robot 100 may either lift the first container 11 located on the first inner support 418 or load the first container at the first inner support 418.

The carriage robot and the tower lifter according to some example embodiments of the present invention may be used in a container transport system for transporting the first container and the second container having sizes different from each other.

Although the example embodiments of the present invention have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A carriage robot comprising:
a robot arm being configured to transport a plurality of containers;
a robot hand connected to an end of the robot arm, the robot hand being configured to support a first container having a lower surface and a first size among the containers; and
a gripper protruded downwardly from a body of the robot hand to be provided under the robot hand, the gripper being configured to grip a second container having a second size different from the first size,
wherein the robot hand supports the first container with entirely contacting the lower surface of the first container and the gripper grips the second container such that the carriage robot is configured to simultaneously transport the first container and the second container by moving the robot hand,
wherein the robot arm has at least a first arm, a second arm and a third arm configured as stacked arms, and the third arm, which is an uppermost arm included in the robot arm, has a thickness matching a height of the second container, and
wherein when the gripper grips the second container, the second arm, positioned under the third arm as the uppermost arm, makes contact with the lower surface of the second container and the second arm supports the second container causing the second container to be suppressed from falling while the carriage robot transports the second container.

2. The carriage robot of claim 1, wherein the second container includes a holding part at an upper portion thereof, and the gripper is configured to grip the holding part in a sliding way.

3. The carriage robot of claim 2, wherein the gripper includes a first gripping part and a second gripping part spaced apart from each other at an interval corresponding to a width of the holding part.

4. The carriage robot of claim 3, wherein each of the first gripping part and the second gripping part has an "L" shape to face each other, and one of the first and the second gripping part includes a photo sensor at an end portion thereof, and the other of the first and the second gripping part includes a reflector at an end portion thereof.

5. The carriage robot of claim 1, further comprising a guide part disposed on a lower surface of the robot hand without interfering the gripper, the guide part being configured to suppress the second container from vibrating while transporting the second container.

6. The carriage robot of claim 1, further comprising a controller configured to adjust an operating speed of the robot arm differently in accordance with a first container and a second container.

7. The carriage robot of claim 1, wherein the robot hand includes a supporting pin corresponding to a guide groove formed on a lower surface of the first container.

8. A tower lift comprising:
a guide rail extending in a vertical direction; and
at least one carriage robot being configured to be movable in the vertical direction along the guide rail, the carriage robot being configured to transport a plurality of containers;
wherein the carriage robot includes:
a robot arm being configured to transport the plurality of containers;
a robot hand connected to an end of the robot arm, the robot hand being configured to support a first container having a lower surface and a first size among the containers; and
a gripper protruded downwardly from a body of the robot hand to be provided under the robot hand, the gripper being configured to grip a second container having a second size different from the first size,
wherein the robot hand supports the first container with entirely contacting the lower surface of the first container and the gripper grips the second container such that the carriage robot is configured to simultaneously transport the first container and the second container by moving the robot hand,
wherein the robot arm has at least a first arm, a second arm and a third arm configured as stacked arms, and the third arm, which is an uppermost arm included in the robot arm, has a thickness matching a height of the second container, and
wherein when the gripper grips the second container, the second arm, positioned under the third arm as the uppermost arm, makes contact with the lower surface of the second container and the second arm supports the second container causing the second container to be suppressed from falling while the carriage robot transports the second container.

9. The tower lift of claim 8, wherein the second container includes a holding part at an upper portion thereof, and the gripper is configured to grip the holding part in a sliding way.

10. The tower lift of claim 9, wherein the gripper includes a first gripping part and a second gripping part spaced apart from each other at an interval corresponding to a width of the holding part.

11. The tower lift of claim 10, wherein each of the first gripping part and the second gripping part has an "L" shape to face each other, and one of the first gripping part and the second gripping part includes a photo sensor at an end portion thereof, and the other of the first gripping part and the second gripping part includes a reflector at an end portion thereof.

12. The tower lift of claim 8, wherein the carriage robot further includes a guide part disposed on a lower surface of the robot hand without interfering the gripper, the guide part being configured to suppress the second container from vibrating while transporting the second container.

13. The tower lift of claim 8, wherein the carriage robot further includes a controller configured to adjust an operating speed of the robot arm differently in accordance with a first container and a second container.

* * * * *